United States Patent
Schön et al.

(10) Patent No.: US 7,847,553 B2
(45) Date of Patent: Dec. 7, 2010

(54) DEVICE CONSISTING OF A COMBINATION OF A MAGNETIC RESONANCE TOMOGRAPH AND A POSITRON EMISSION TOMOGRAPH

(75) Inventors: Lothar Schön, Neunkirchen (DE); Stefan Stocker, Grossenseebach (DE)

(73) Assignee: Siemens Aktiengesellschaft, Munich (DE)

( * ) Notice: Subject to any disclaimer, the term of this patent is extended or adjusted under 35 U.S.C. 154(b) by 286 days.

(21) Appl. No.: 12/081,672

(22) Filed: Apr. 18, 2008

(65) Prior Publication Data
US 2008/0303524 A1 Dec. 11, 2008

(30) Foreign Application Priority Data
Apr. 24, 2007 (DE) .................. 10 2007 019 296

(51) Int. Cl.
*G01V 3/00* (2006.01)
(52) U.S. Cl. ...................................... 324/318
(58) Field of Classification Search ......... 324/300–322; 600/407–445; 62/3.2, 259.2; 250/370.11, 250/363.03
See application file for complete search history.

(56) References Cited

U.S. PATENT DOCUMENTS

| | | | |
|---|---|---|---|
| 5,821,541 A * | 10/1998 | Tumer | 250/370.09 |
| 6,990,176 B2 * | 1/2006 | Sherman et al. | 378/98.8 |
| 2005/0138934 A1 * | 6/2005 | Weigert et al. | 62/3.2 |
| 2006/0058683 A1 * | 3/2006 | Chance | 600/476 |
| 2007/0096031 A1 * | 5/2007 | Meier et al. | 250/370.11 |
| 2009/0012387 A1 * | 1/2009 | Hanson et al. | 600/411 |
| 2009/0021728 A1 * | 1/2009 | Heinz et al. | 356/244 |
| 2009/0272517 A1 * | 11/2009 | Corbeil et al. | 165/166 |

FOREIGN PATENT DOCUMENTS

| | | |
|---|---|---|
| JP | 05145090 | 6/1993 |
| WO | WO 03/069744 | 8/2003 |
| WO | WO 2006/071922 | 7/2006 |

OTHER PUBLICATIONS

German Office Action for corresponding German Application No. 10 2007 019 296.9-52 dated Aug. 11, 2008.

* cited by examiner

*Primary Examiner*—Brij B Shrivastav
(74) *Attorney, Agent, or Firm*—Harness, Dickey & Pierce, P.L.C.

(57) ABSTRACT

At least one embodiment is directed to a combination of an MR tomograph and a positron emission tomograph having avalanche photodiodes as reception elements. In at least one embodiment, the intention is to ensure that the avalanche photodiodes are kept at a constant temperature despite the exposure to heat from the MR components. It is proposed, in at least one embodiment, that cooling by Peltier elements 5 should be provided.

2 Claims, 1 Drawing Sheet

DEVICE CONSISTING OF A COMBINATION OF A MAGNETIC RESONANCE TOMOGRAPH AND A POSITRON EMISSION TOMOGRAPH

PRIORITY STATEMENT

The present application hereby claims priority under 35 U.S.C. §119 on German patent application number DE 10 2007 019 296.9 filed Apr. 24, 2007, the entire contents of which is hereby incorporated herein by reference.

FIELD

Embodiments of the present invention generally relate to a device including a combination of a magnetic resonance tomograph (MR) and a positron emission tomograph (PET) having avalanche photodiodes as reception elements of the PET.

BACKGROUND

The combination of a magnetic resonance tomograph with a positron emission tomograph entails heating problems.

The avalanche photodiodes to be used as PET reception diodes are highly sensitive to temperature fluctuations, and must therefore be kept relatively accurately at an operating temperature. On the other hand, owing to the nature of the system, they must be arranged in immediate proximity to time-variable heat sources, such as the gradient coil and the body coil. Furthermore, there are electronic components that generate a heat loss in their vicinity. Another fact which makes it difficult to cool the avalanche photodiodes effectively is that the PET part of the device must be packaged in a radiofrequency-proof housing, in order to avoid mutual interference of the PET and MR.

SUMMARY

In at least one embodiment of the invention, the aforementioned heating problem existing in a device of the type mentioned in the introduction is improved upon or even resolved.

The Peltier elements used to cool the avalanche photodiodes transport heat, which is generated during MR operation, from the vicinity of the avalanche photodiodes to cooling arrangements. It is thereby possible to place the avalanche photodiodes and optionally the other PET electronics at a constant operating temperature.

In at least one embodiment, the Peltier elements are respectively arranged between the body coil and the avalanche photodiodes of the PET detector. One Peltier element is preferably assigned to each avalanche photodiode. The Peltier elements are thus distributed flatly, but separately, over the inner surface of the scanning tunnel of a combined MR-PET machine. A Peltier element has for instance an edge length of about 20-60 mm, preferably 30-40 mm.

A number of advantages are achieved by at least one embodiment of the invention. Besides the aforementioned stability of the operating temperature, at least one embodiment of the invention achieves short transient times and therefore rapid measurement readiness of the MR-PET device. Since Peltier elements generate a temperature difference, it is possible to achieve operating temperatures lower than those corresponding to the refrigerant temperature. At lower operating temperatures, the noise is reduced and the image quality can be improved. In a corresponding configuration, each PET cassette can function autonomously and is not dependent on a cooled environment. Connection to a cooled environment is technically difficult to carry out, since air gaps need to be bridged.

BRIEF DESCRIPTION OF THE DRAWINGS

For further explanation of the invention, reference will be made to the example embodiments described with the aid of the figures.

DETAILED DESCRIPTION OF THE EXAMPLE EMBODIMENTS

Figure 1:
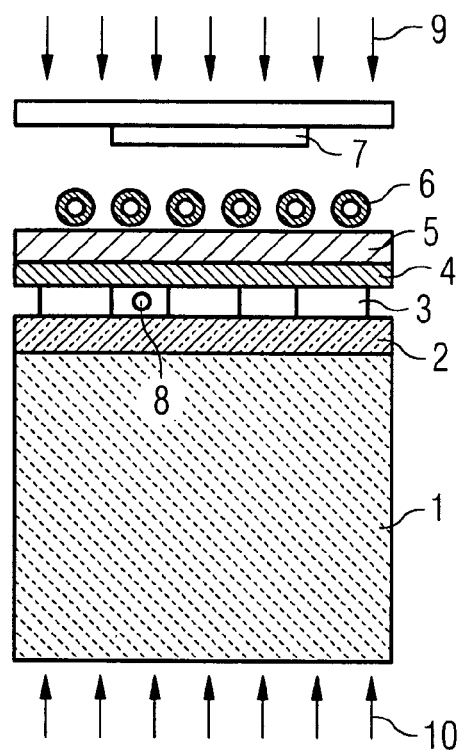
FIG. 1 shows a cross section through a first example embodiment of the invention.

Various example embodiments will now be described more fully with reference to the accompanying drawings in which only some example embodiments are shown. Specific structural and functional details disclosed herein are merely representative for purposes of describing example embodiments. The present invention, however, may be embodied in many alternate forms and should not be construed as limited to only the example embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the present invention to the particular forms disclosed. On the contrary, example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. As used herein, the terms "and/or" and "at least one of" include any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, term such as "below" can encompass both an orientation of above and below. The device may be otherwise oriented (rotated 90 degrees or at other orientations) and the spatially relative descriptors used herein are interpreted accordingly.

Although the terms first, second, etc. may be used herein to describe various elements, components, regions, layers and/or sections, it should be understood that these elements, components, regions, layers and/or sections should not be limited by these terms. These terms are used only to distinguish one element, component, region, layer, or section from another region, layer, or section. Thus, a first element, component, region, layer, or section discussed below could be termed a second element, component, region, layer, or section without departing from the teachings of the present invention.

Figure 2:
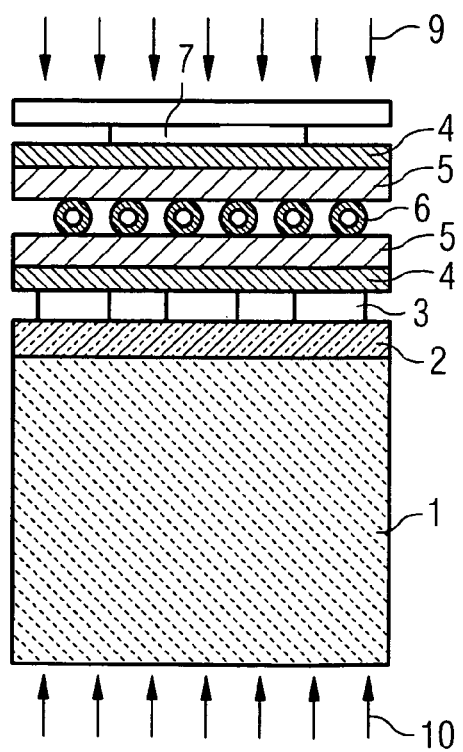
FIG. 2 shows a cross section through a second example embodiment of the invention.

FIGS. 1 and 2 respectively show a detail of that region of a combined MR-PET machine which lies between the body coil and the PET reception elements (the avalanche photodiodes). The device, in at least one embodiment, preferably extends over the entire circumference and the entire axial length of the PET reception elements. However, only a cross section through a detail of such a device is shown in the figures.

In the example embodiment represented in FIG. 1, a light guide 2 is arranged on a lutetium oxyorthosilicate (LSO) crystal 1 which generates a light pulse in response to a PET signal, and avalanche photodiodes 3 are arranged on top. A layer 4 with high thermal conductivity is provided above the avalanche photodiodes 3, which establishes good thermal coupling between the avalanche photodiodes 3 and the Peltier elements 5 arranged above. The hot side of the Peltier element adjoins a cooling device 6, which thus ensures the thermal dissipation. A temperature sensor 8, which in conjunction with a control device (not shown) ensures constancy of the temperature of the avalanche photodiodes, is furthermore provided in the vicinity of the avalanche photodiodes 3. The actual heat-generating PET electronics 7 are represented above the cooling device 6. The arrows 9 symbolize the heat generated by the gradient coil (not shown), and the arrows 10 correspondingly symbolize the heat coming from the body coil.

FIG. 2 shows another exemplary embodiment of the invention. Two Peltier elements 5 are used in this exemplary embodiment, with the hot sides of the Peltier elements 5 facing toward each other and a cooling device 6 respectively being arranged between them. The cold side of one of the Peltier elements 5 adjoins the avalanche photodiodes 3, and the cold side of the other Peltier element 5 adjoins the PET electronics 7. A layer 4 with high thermal conductivity is respectively arranged between the Peltier elements 5 and the PET electronics 7, and between the Peltier elements 5 and the photodiodes 3.

The invention is not however restricted to the example embodiments represented in the figures. Thus, with a different arrangement of the components that generate heat, another arrangement of the Peltier elements and the cooling arrangement may be selected if appropriate.

Example embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A device, comprising:
    a magnetic resonance tomograph (MR); and
    a positron emission tomograph (PET) including avalanche photodiodes as reception elements of the PET, and including Peltier elements to cool the avalanche photodiodes;
    a temperature sensor in conjunction with a control instrument to regulate a temperature of the avalanche photodiodes; and
    two Peltier elements arranged with their hot sides facing each other, wherein a cooling instrument is provided between the two Peltier elements, while the avalanche photodiodes and the PET electronics are respectively arranged on the cold sides of the two Peltier elements.

2. The device as claimed in claim 1, further comprising a layer with high thermal conductivity, arranged between the Peltier elements and the avalanche photodiodes.

* * * * *